United States Patent [19]
Baek

[11] Patent Number: 5,835,274
[45] Date of Patent: Nov. 10, 1998

[54] MASK FOR PATTERNING A MICROLENS

[75] Inventor: Euy Hyeon Baek, Cheongju-si, Rep. of Korea

[73] Assignee: LG Semicon Co., Ltd., Chungcheongbuk-Do, Rep. of Korea

[21] Appl. No.: 783,901

[22] Filed: Jan. 16, 1997

[30] Foreign Application Priority Data

May 16, 1996 [KR] Rep. of Korea ............ 16465/1996

[51] Int. Cl.$^6$ ............................................ G02B 27/10
[52] U.S. Cl. ............ 359/619; 359/891; 359/893; 359/888
[58] Field of Search ............ 359/619, 629, 359/636, 891, 893, 888

[56] References Cited

U.S. PATENT DOCUMENTS

| | | | |
|---|---|---|---|
| 3,909,524 | 9/1975 | Ohkoshi et al. | 359/888 |
| 4,157,215 | 6/1979 | Hanak | 359/888 |
| 4,674,838 | 6/1987 | Hieber et al. | 359/893 |
| 4,762,396 | 8/1988 | Dumant et al. | 359/893 |
| 4,928,008 | 5/1990 | Huggins et al. | 359/888 |
| 5,016,981 | 5/1991 | Peppers et al. | 359/888 |
| 5,301,063 | 4/1994 | Tohmon | 359/619 |

*Primary Examiner*—Loha Ben
*Attorney, Agent, or Firm*—Morgan, Lewis & Bockius LLP

[57] ABSTRACT

A mask for patterning a microlens includes a glass substrate, a main light-blocking region formed on a predetermined area of the glass substrate, and auxiliary light-blocking regions formed around the main light-blocking region or on a part of the main light-blocking region such that as the intervals between the main and auxiliary light-blocking regions become longer, the intensity of light transmitted thereto becomes greater.

36 Claims, 10 Drawing Sheets

MASK FOR PATTERNING A MICROLENS

BACKGROUND OF THE INVENTION

1. Field of the Invention

The present invention relates to a semiconductor device, and more particularly, to a mask for patterning a microlens for a semiconductor device.

2. Discussion of the Related Art

In general, a microlens is used to focus incident light on a surface of a semiconductor device. In a solid-state image sensor, such a microlens is assigned to each photodiode in order that light from an object is focused on the corresponding photodiode of the device through the microlens sequentially to produce an electric signal. As shown in FIG. 1, the solid-state image sensor includes a plurality of photodiodes which are formed in a matrix and convert incident light to an electrical signal by photoelectric conversion to produce a charge. A plurality of vertical charge coupled devices (VCCD) are formed in columns between the photodiodes to enable the vertical transfer of the stored charge. A horizontal charge coupled device (HCCD) is formed at ends of the VCCDs to enable the horizontal transfer of the charge transmitted from the VCCDs.

The solid-state image sensor also includes a sense amplifier (SA) that senses the image signal transferred from the HCCD to produce an electrical signal, color filter layers, and microlens over the photodiodes (not shown).

The structure of the above general solid-state image sensor is described in detail with reference to FIG. 2, which shows a sectional view taken along line I–I'.

In the solid-state image sensor shown in FIG. 2, the photodiodes 2 for converting incident light to an electrical signal are formed in a matrix spaced from each other on a semiconductor substrate 1, and the VCCDs 3 are interposed between the photodiodes 2. A first planarization layer 4 is formed over the semiconductor substrate 1 where the photodiodes 2 and VCCDs 3 are formed, and a color filter layer 5 is formed on the first planarization layer 4. A second planarization layer 6 is also formed over the color filter layer 5, and microlens 7 are formed corresponding to the photodiodes 2. The microlens 7 serve to focus maximum amount of light from an object onto the corresponding photodiodes 2.

The following description relates to a conventional mask used to patterning such microlens and a method for making a microlens by using the conventional mask.

FIG. 3 is a plan view of a conventional mask for patterning a microlens, and FIG. 4 is a sectional view taken along line II–II' of FIG. 3. FIG. 5 depicts photo-transmittance characteristics of the conventional mask.

Referring to FIGS. 3 and 4, square-shaped or rectangular-shaped light blocking layers 9 are formed on a glass substrate 8 to prevent the regions where microlens are formed from being exposed to light. The photo-transmittance characteristics of the conventional mask depicted in FIG. 5 is such that the light blocking layers 9 are impervious to light while regions other than the light blocking layers 9 transmit light.

A method for making a conventional microlens by using such a mask is now described. FIGS. 6A to 6C depict the steps in the manufacture of a conventional microlens.

As shown in FIG. 6A, a photosensitive layer 7a is coated onto the planarization layer 6. Subsequently, the photosensitive layer 7a is exposed to light and developed using the mask of FIG. 3 to form photosensitive patterns 7b over the photodiode regions at a predetermined distance from each other, which is depicted in FIG. 6B. These photosensitive patterns 7b may have a square or rectangular shape according to the shape of a cell. Performing heat treatment reflows the photosensitive patterns 7b to fabricate microlens 7, as shown in FIG. 6C.

However, the conventional microlens made through the above process have the following disadvantage.

As the curvature radius of the microlens becomes small, the incident light is focused on a point near the microlens. Thus, the photosensitive layer is patterned to be square or rectangular in shape according to the shape of a cell, using a mask that is simply divided into a light blocking region and a light-transmissive region, and is thermally treated to form a microlens. Thus, a curvature radius of the microlens is decreased. Moreover, because a microlens formed in a rectangular shape has a significant difference between its curvature radius in the width and the length directions, it is difficult to focus incident light on the corresponding photodiode without error, and a part of the light is focused on the planarization layer or color filter layer between the photodiode and the microlens, causing loss of light and deterioration of resolution.

SUMMARY OF THE INVENTION

Accordingly, the present invention is directed to a mask for patterning a microlens that substantially obviates one or more of the problems due to limitations and disadvantages of the related art.

It is an object of the present invention to provide a mask for patterning a microlens having a radius of curvature that can be enlarged.

Another object of the present invention is to provide a mask for patterning a microlens having a radius of curvature that is substantially the same in the width direction as in the length direction.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a mask for patterning a microlens includes a glass substrate, a main light-blocking region formed on a predetermined area of the glass substrate, and auxiliary light-blocking regions formed around the main light-blocking region or on a part of the main light-blocking region in order that the longer the intervals between the main and auxiliary light-blocking regions become, the greater the intensity of light transmitted thereto becomes.

In another aspect of the present invention, a mask for patterning a microlens comprises a substrate; a first light-blocking region on an area of the substrate; and a plurality of second light-blocking regions being spaced from the first light-blocking region, wherein a greater intensity of light is transmitted through the plurality of second light-block regions as the second light-blocking regions are spaced further apart from the first light-blocking region.

In another aspect of the present invention, a mask for patterning a microlens comprises a substrate; a first light-blocking region on an area of the substrate; and a plurality of second light-blocking regions being spaced from the first light-blocking region, wherein a lesser intensity of light is transmitted through the plurality of second light-block regions as the second light-blocking regions are spaced further apart from the first light-blocking region.

In another aspect of the present invention, a mask for patterning a microlens comprises a substrate; a main light-blocking layer on an area of the substrate; and a plurality of auxiliary light-blocking layers surrounding the main light-blocking layer.

In another aspect of the present invention, a mask for patterning a microlens comprises a substrate; a light-transmissive layer on an area of the substrate; and a plurality of light-blocking layers surrounding the light-transmissive layer.

In another aspect of the present invention, a mask for patterning a microlens in a rectangular cell having a main light-blocking region and an auxiliary light-blocking region comprises a substrate; a first main light-blocking layer on the substrate; a plurality of second main light-blocking layers connected to the first main light-blocking layer along a first axis and each having a substantially trapezoidal shape; and a plurality of auxiliary light-blocking layers at the auxiliary light-blocking region adjacent to the first and second main light-blocking layers.

In a further aspect of the present invention, a mask for patterning a microlens in a rectangular cell having a main light-blocking region and an auxiliary light-blocking region comprises a substrate; a first light-transmissive layer on the substrate; a plurality of second light-transmissive layers connected to the first main light-blocking layer along a first axis and each having a substantially trapezoidal shape; and a plurality of auxiliary light-blocking layers at the light-blocking layers adjacent to the first and second light-transmissive layers.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENTS

Reference will now be made in detail to the preferred embodiments of the present invention, examples of which are illustrated in the accompanying drawings.

First Preferred Embodiment

Figure 1:
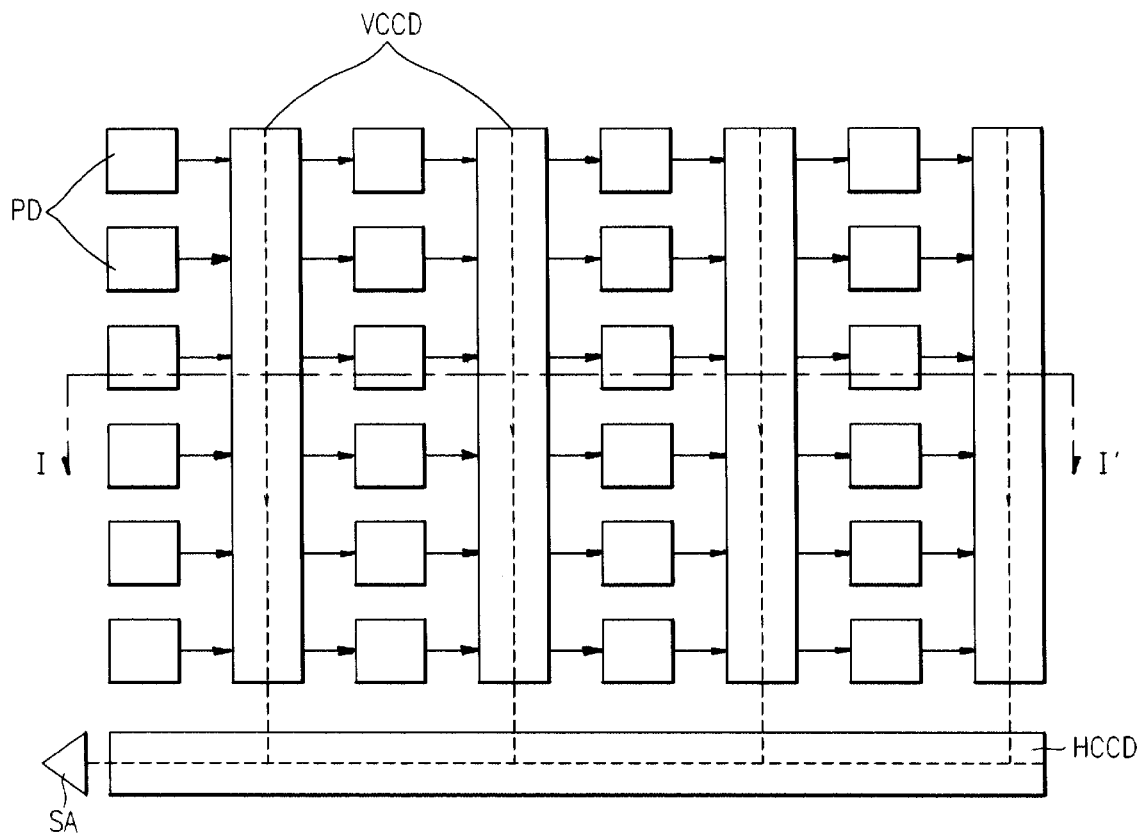
FIG. 1 depicts a layout of a general solid-state image sensor.
Figure 2:
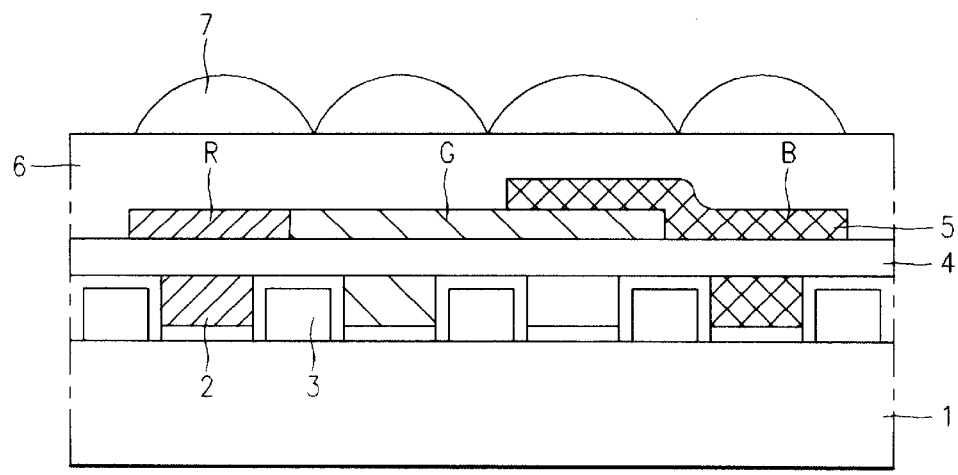
FIG. 2 depicts a sectional view taken along line I–I' of FIG. 1.
Figure 3:
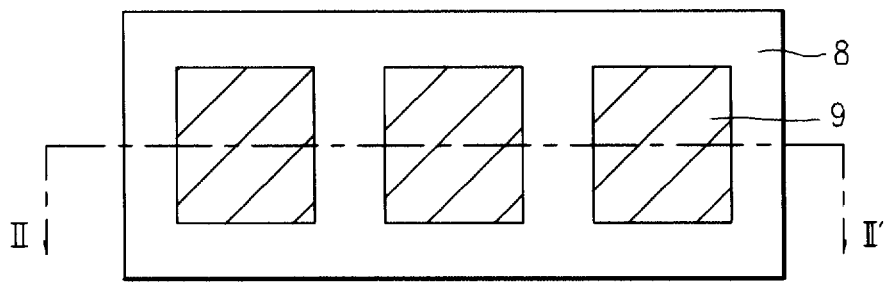
FIG. 3 is a plan view of a conventional mask for patterning a microlens of a semiconductor device.
Figure 4:
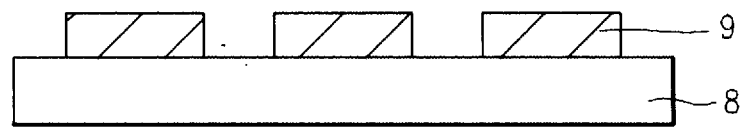
FIG. 4 is a sectional view taken along line II–II' of FIG. 3.
Figure 5:
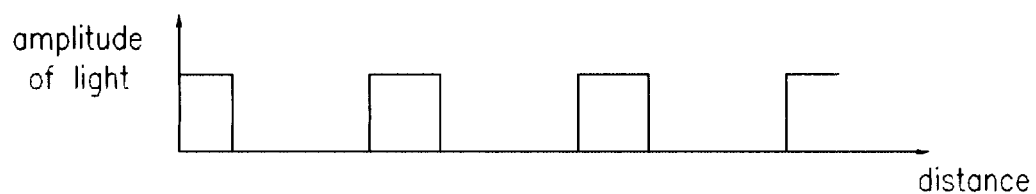
FIG. 5 depicts photo-transmittance characteristics of the conventional mask.
Figure 6A:
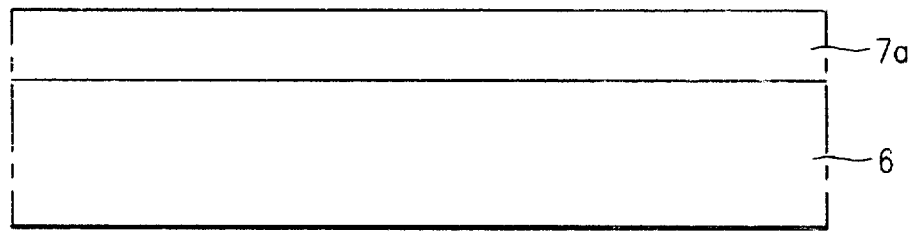
FIGS. 6A to 6C depict the steps in the manufacture of a conventional microlens by using a conventional mask for patterning a microlens of a semiconductor device.
Figure 6B:
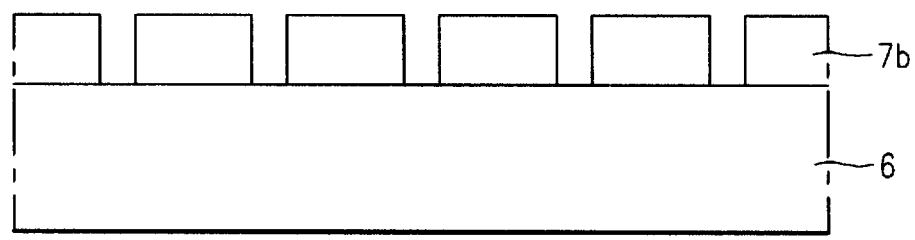
Figure 6C:
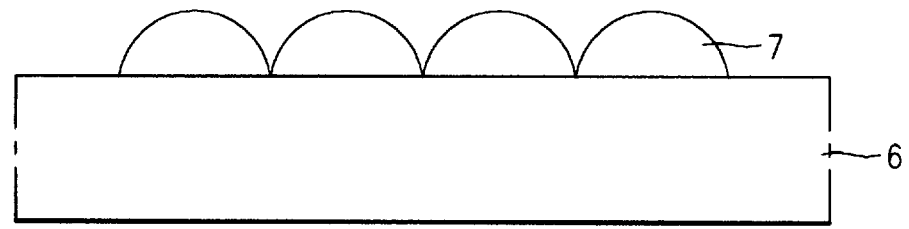
Figure 7:
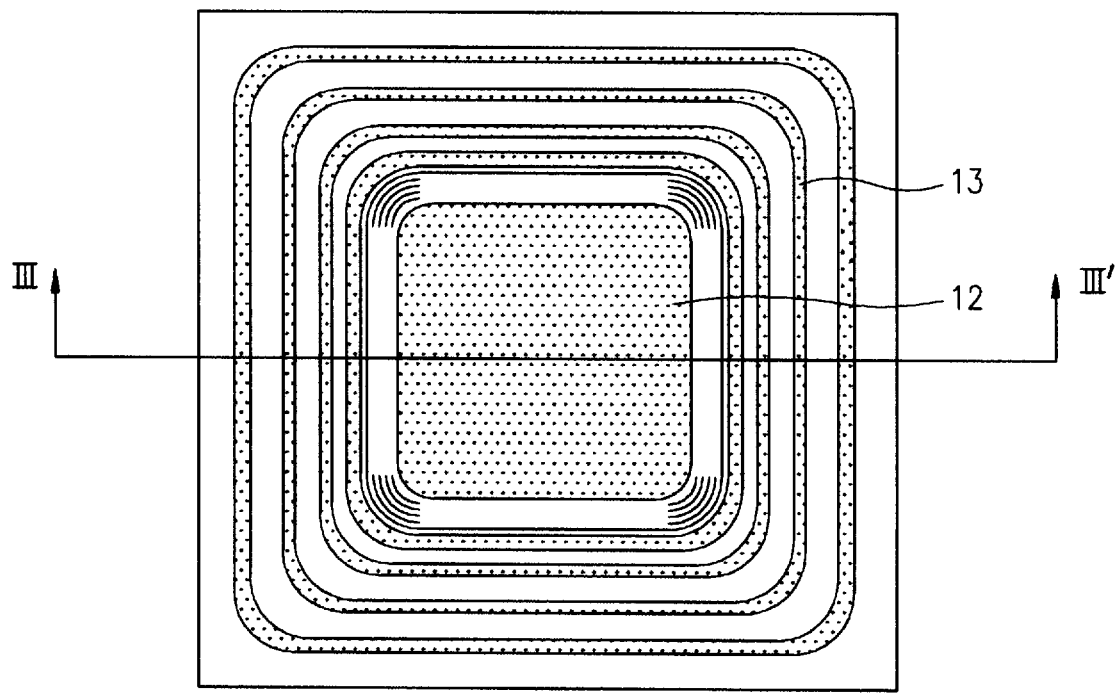
FIG. 7 is a plan view of a mask for patterning a microlens in accordance with a first preferred embodiment of the present invention.
Figure 8:
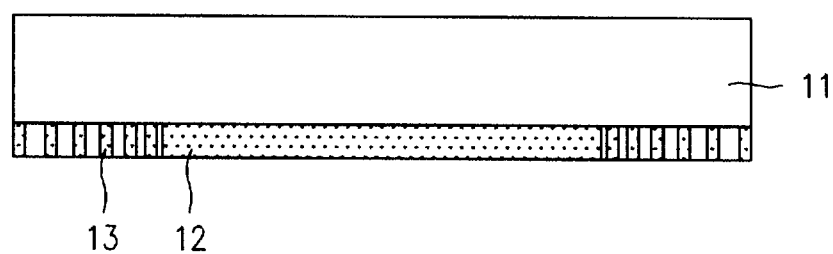
FIG. 8 is a sectional view taken along line III–III' of FIG. 7.

FIG. 7 is a plan view of a mask for patterning a microlens of a semiconductor device in accordance with a first preferred embodiment of the present invention, and FIG. 8 is a sectional view taken along line III–III' of FIG. 7.

The first embodiment of the present invention relates to a mask for patterning a microlens for a cell having a square shape. A main light-blocking layer (Cr) 12 that perfectly shuts light off is formed on a portion of a glass substrate 11 corresponding to the center of a microlens. The main light-blocking layer 12 is enclosed or surrounded by a plurality of auxiliary light-blocking layers 13 that are formed at a predetermined distance from each other.

Each auxiliary light-blocking layer 13 is designed to have a regular width. Thus, longer intervals between the auxiliary light-blocking layers 13 and the main light blocking layer 12 allow greater intensity of light to be transmitted to the auxiliary light-blocking layers 13. Moreover, as the distances or intervals between the auxiliary light-blocking layers 13 and main one 12 become longer, the space between the auxiliary light-blocking layers 13 become wider. Alternative, the widths of the auxiliary light-blocking layers 13 may be made narrower as the layers 13 move further away from the main light-blocking layer 12, while maintaining an even space between the auxiliary light-blocking layers 13. Thus, in this instance, since the auxiliary layers 13 become narrower, the intervals between the layers 13 become wider.

Figure 9:
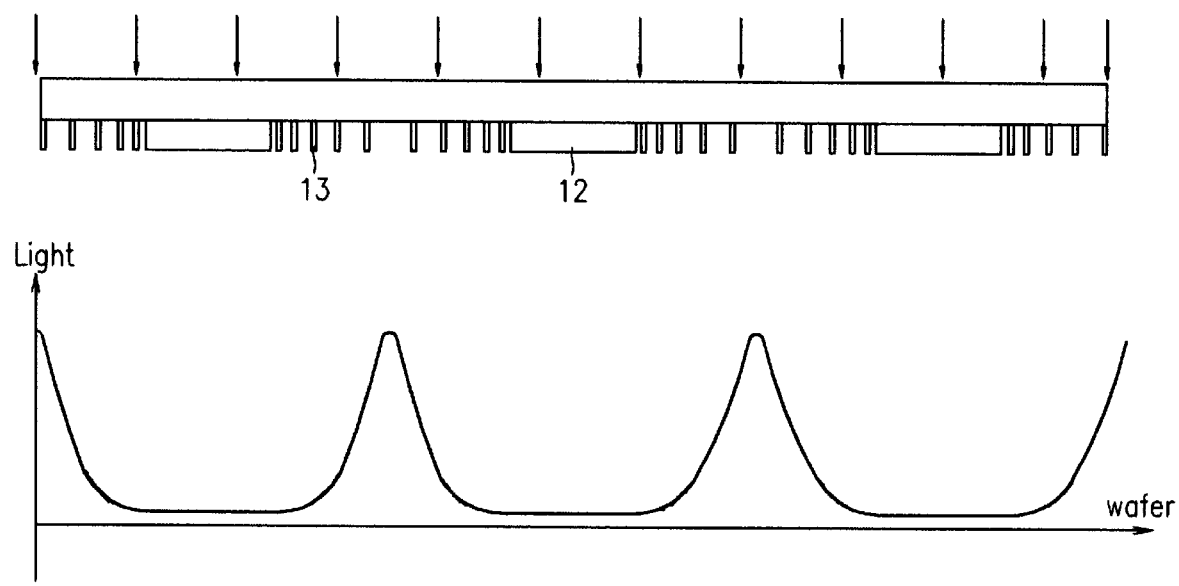
FIG. 9 shows graphically the photo-transmittance characteristics of the mask for patterning a microlens in accordance with the first preferred embodiment of the present invention.

FIG. 9 shows graphically the photo-transmittance characteristics of the mask for patterning a microlens of the present invention. Here, the light transmitted to the mask has the following feature. The intensity of incident light decreases at the main light-blocking layer 12 of the wafer, and light intensity increases at the areas distant from the main light-blocking layer 12. The photosensitive layer is exposed to light by using the mask of the present invention to form a pattern having a rounded contour.

Second Preferred Embodiment

Figure 10:
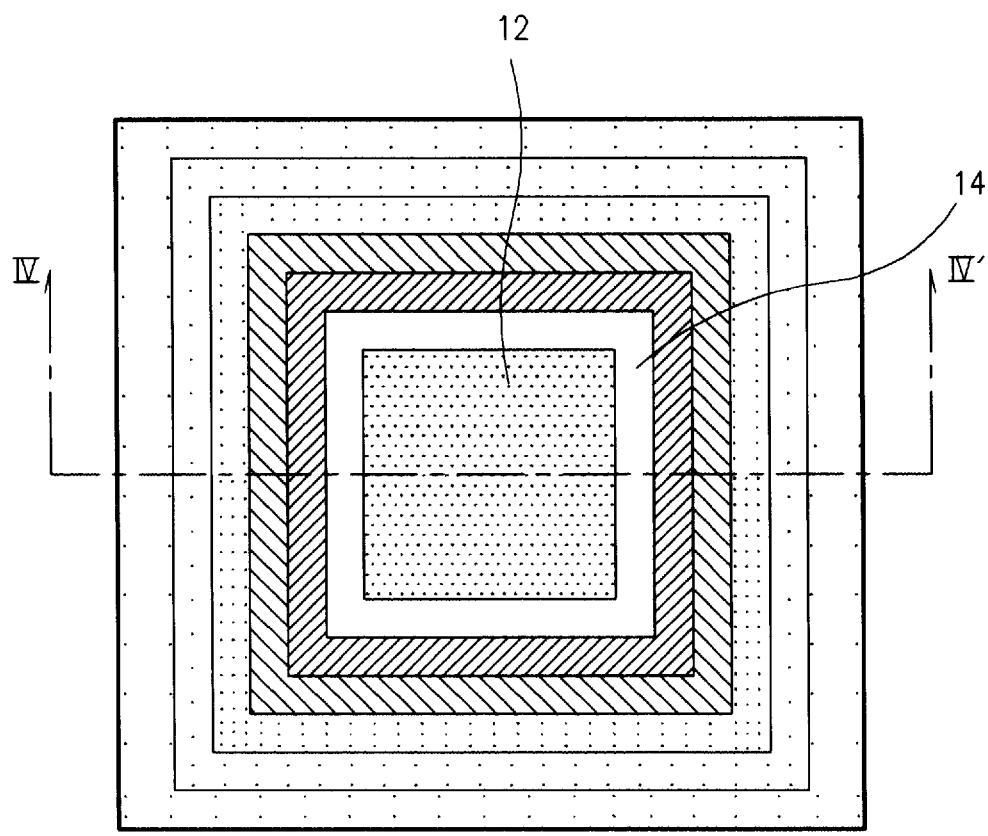
FIG. 10 is a plan view of a mask for patterning a microlens in accordance with a second preferred embodiment of the present invention.
Figure 11:
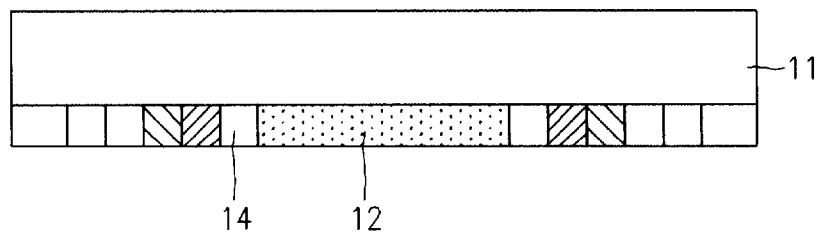
FIG. 11 is a sectional view taken along line IV–IV' of FIG. 10.

FIG. 10 depicts a plan view of a mask for patterning a microlens of a semiconductor device in accordance with a second preferred embodiment of the present invention, and FIG. 11 is a sectional view taken along line IV–IV' of FIG. 10.

The second embodiment of the present invention relates to a half-tone mask for patterning a microlens for a cell having a square shape. A main light-blocking layer (Cr) 12 that preferably shuts light off perfectly is formed having a square shape on a portion of a glass substrate corresponding to the center of a microlens. The main light-blocking layer 12 is enclosed by a plurality of half-tone light-blocking layers 14 having a different photo-transmittivity from that of the main light-blocking layer 12. The half-tone light-blocking layers 14 adjacent to the main light-blocking layer 12 are made from a material having a low photo-transmittivity, and the outermost one of the half-tone light blocking layers 14 is made from a material having a higher photo-transmittivity than that of the other layers. The photo-transmittance characteristics of the mask according to the second preferred embodiment are similar to the first preferred embodiment.

Third Preferred Embodiment

Figure 13:
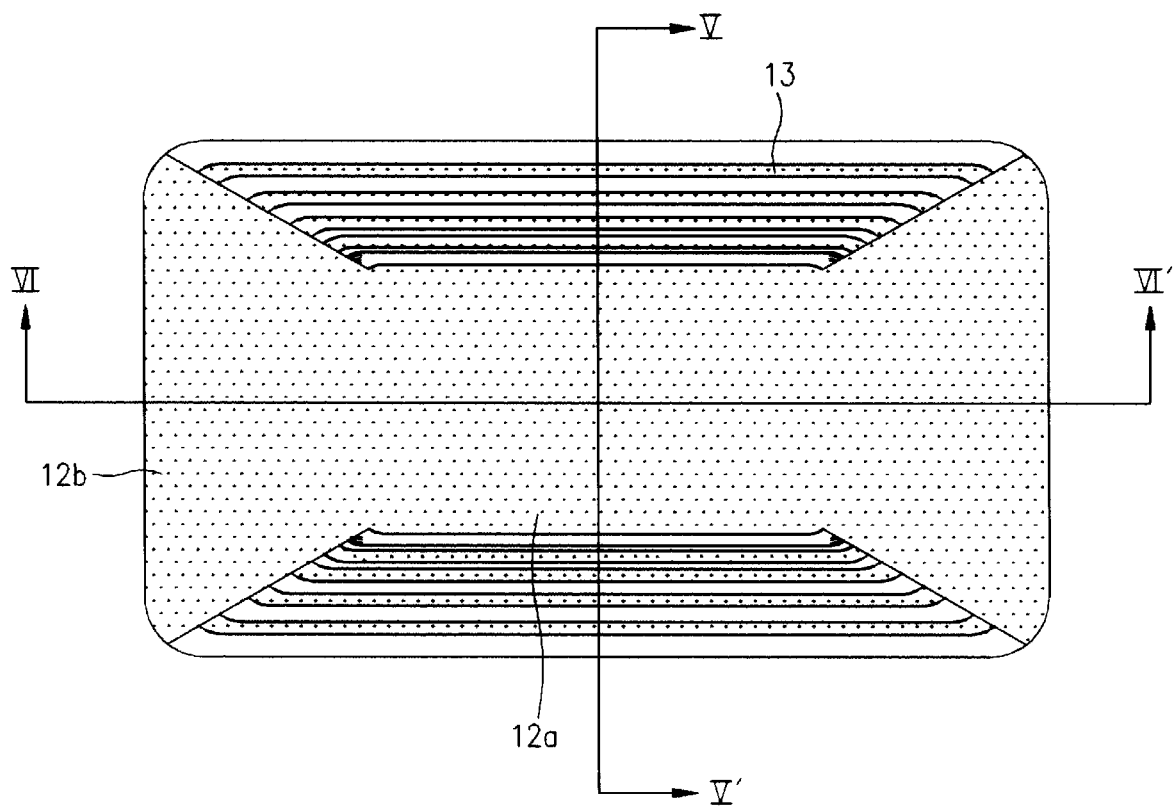
FIG. 13 depicts a plan view of a mask for patterning a microlens of a semiconductor device in accordance with a third preferred embodiment of the present invention.
Figure 14A:
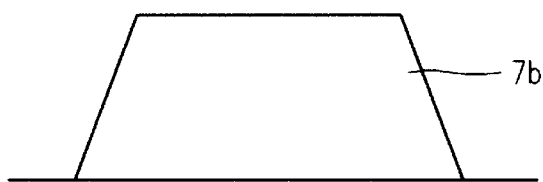
FIGS. 14A and 14B depict sectional views taken along lines VI–VI' and V–V' of FIG. 13, respectively, of a photoresist pattern formed by using the mask of the third preferred embodiment of the present invention.
Figure 14B:
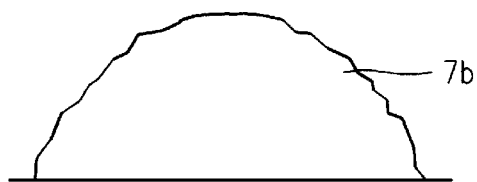
Figure 15A:
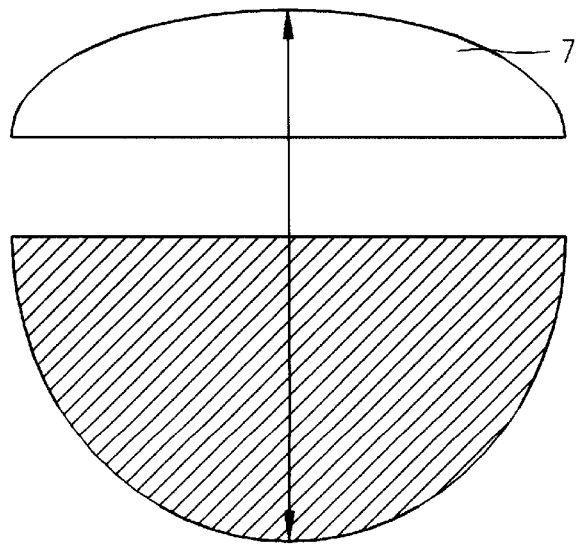
FIGS. 15A and 15B depict sectional views of a microlens in accordance with the third preferred embodiment of the present invention.
Figure 15B:
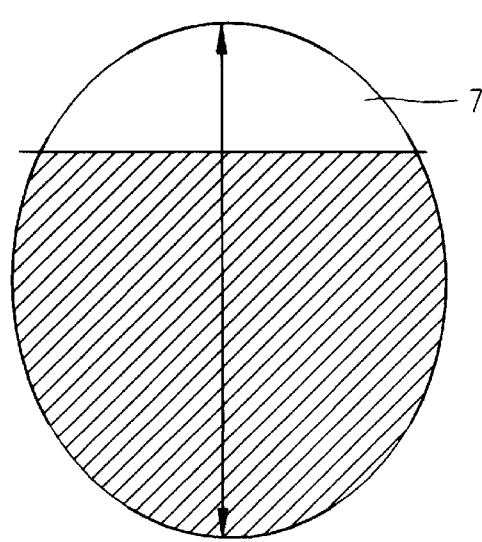
Figure 16:
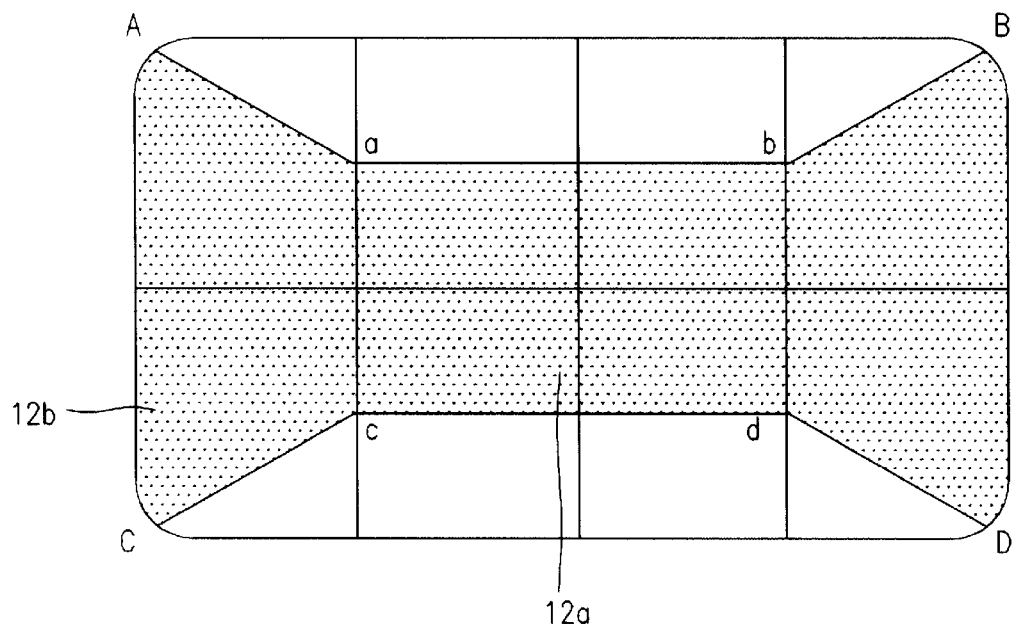
FIG. 16 is a plan view for illustrating the structure of the mask of FIG. 13.

FIG. 13 depicts a plan view of a mask for patterning a microlens of a semiconductor device in accordance with a third preferred embodiment of the present invention. FIG. 14A is a sectional view taken along a major axis line of VI–VI' of FIG. 13, and FIG. 14B is a sectional view taken along a minor axis line of V–V' of FIG. 13. FIG. 15A depicts the shape of a lens viewed from the major axis and its curvature radius and FIG. 15B depicts the shape of a lens viewed from the minor axis and its curvature radius. FIG. 16 is a plan view illustrating the structure of the mask of FIG. 13.

Referring to FIG. 13, the third embodiment of the present invention relates to a mask for patterning a microlens for a cell having a rectangular shape. Auxiliary light-blocking layers 13 are formed in the minor axial direction of the cell and the main light-blocking part has a first main light-blocking layer 12a and a plurality of second main light-blocking layers 12b. For the rectangular shaped cell, the first main light-blocking layer 12a is formed at the center of the cell and smaller than the cell, and the second main light-blocking layers 12b are formed at both sides of the first main light-blocking layer 12a in the major axial direction. The second main light-blocking layers 12b have a trapezoidal shape. A plurality of the auxiliary light-blocking layers 13 are formed at the area of the cell where the first and second main light-blocking layers 12a and 12b are not formed, as shown in FIG. 13.

The structure of the mask of the third preferred embodiment is now described in more detail.

As the intervals between the auxiliary light-blocking layers 13 and main light-blocking layers become longer, the photo-transmittivity increases. Thus, the photoresist layer is patterned by using the mask of the preferred embodiment of the present invention to form a pattern as shown in FIGS. 14A and 14B. The photoresist pattern 7b in the major axial direction without the auxiliary light-blocking layers 13 has a trapezoidal contour, as shown in FIG. 14A. The photoresist pattern 7b in the direction of the minor axis having the auxiliary light-blocking layers 13 has a rounded contour, as shown in FIG. 14B. Heat treatment is performed on the photoresist pattern 7b to form a microlens whose curvature width can be designed to be the same as the one in length as shown in FIGS. 15A and 15B.

Fourth Preferred Embodiment

A fourth preferred embodiment of the present invention relates to a mask for patterning a microlens for a cell having a rectangular shape and is an alternative embodiment to the third preferred embodiment. The fourth embodiment is the same for the first and second main light-blocking layers as in the third embodiment shown on FIG. 13. For the auxiliary layers, half-tone light-blocking layers are used in the fourth embodiment similar to the second embodiment discussed above with respect to FIGS. 10 and 11.

Fifth Preferred Embodiment

A fifth preferred embodiment of the present invention relates to a negative-type mask for patterning a microlens having the same structure as those of the first, second, third and fourth preferred embodiments of the present invention.

When a microlens is fabricated by using a negative photoresist layer, the arrangement of light-transmissive and light-blocking regions in the mask is different from that of the first preferred embodiment. Referring to FIG. 7, each auxiliary light-blocking layer 13 is designed to have a regular width such that as the intervals between the auxiliary light-blocking layers 13 and the main one 12 become longer, the light intensity becomes smaller. Moreover, as the intervals between the auxiliary light-blocking layers 13 and the main one 12 become longer, the space between the auxiliary light-blocking layers 13 can become narrower. In an alternative method, the width of the outermost ones of the auxiliary light-blocking layers 13 from the main light-blocking layer 12 may be made wider than the others, while keeping the space between the auxiliary light-blocking layers 13 even to produce a similar result.

The second embodiment of the present invention may be modified in the fifth embodiment by interchanging light-transmissive and light-blocking regions with each other. In other words, the main light-blocking layer 12 becomes a light-transmissive region, and a plurality of half-tone light-blocking layers 14 adjacent to the main light-blocking layer 12 are made from a material having a high photo-transmittivity. The outermost ones of the half-tone light blocking layers 14 is made from a material having a lower photo-transmittivity than that of the other layers.

The third and fourth embodiments of the present invention also may be modified in the fifth embodiment by interchanging light-transmissive and light-blocking regions with each other.

Accordingly, in the fifth embodiment, the photo-transmissive characteristic of the mask for patterning a microlens becomes complementary to the one graphically shown in FIG. 9. When a negative photoresist layer is used, the photoresist pattern 7b is the same as that of the first or second preferred embodiment, which will be discussed in more detail below.

The steps in the manufacture of a microlens by using the mask of the present invention mentioned above are depicted in FIGS. 12A to 12C.

Figure 12A:
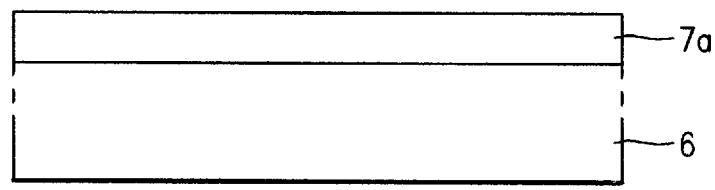
FIGS. 12A to 12C depict the steps in manufacturing a microlens in accordance with the first preferred embodiment of the present invention.
Figure 12B:
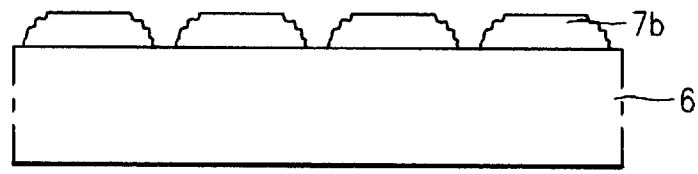

A photoresist layer 7a is applied to a planarization layer 6, as shown in FIG. 12A. When the mask of the first or second preferred embodiment is used, a positive photoresist layer is deposited, and when the mask of the third or fourth preferred embodiment is used, a negative photoresist layer is deposited. Referring to FIG. 12B, by using the mask of the first, second, third or fourth preferred embodiment, the photoresist layer is exposed to light and developed to form photoresist patterns 7b over the photodiodes at a predetermined distance from each other. The mask for patterning a microlens has either light-transmissive characteristics of FIG. 9 or characteristics complement to FIG. 9, and the photoresist pattern 7b has a rounded contour.

Figure 12C:
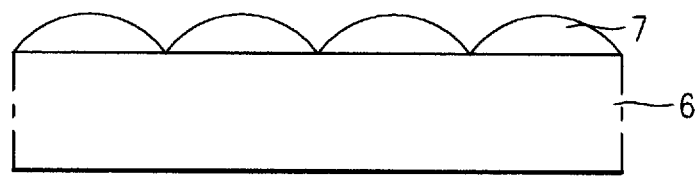

As shown in FIG. 12C, each photoresist pattern 7b is thermally treated to reflow thereby forming a microlens 7. The microlens fabricated through the above process of the present invention has a larger radius of curvature than that of a conventional lens.

The mask for patterning a microlens and the method for making a microlens by using the mask have the following advantages.

Figures 17A, 17B:
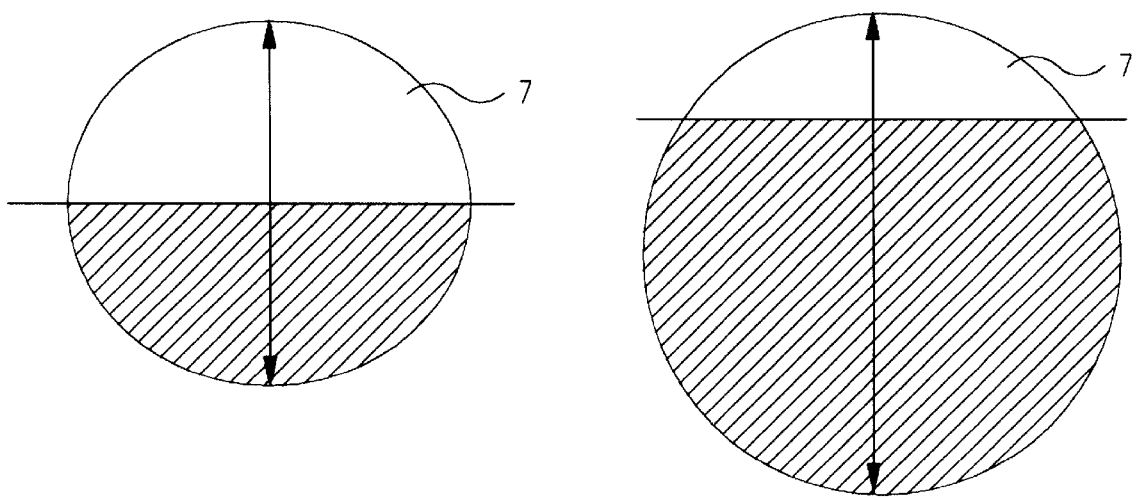
FIGS. 17A and 17B show a comparison between a curvature radius of a conventional lens and a curvature radius of the microlens of the present invention.

First, when the shape of a cell is a square, the main light-blocking layer of the mask is surrounded by auxiliary light-blocking layers whose photo-transmittivity becomes higher as the intervals between the main and auxiliary layers become longer. The photoresist layer is exposed to light and developed by using this mask thereby forming a photoresist pattern with a rounded contour, and by reflowing the photoresist pattern, the microlens's curvature becomes larger than that of a conventional one. This can be more clearly understood from FIG. 17A showing a radius of curvature of a microlens made by using a conventional mask and FIG. 17B depicting a curvature radius of a microlens fabricated by the mask of the present invention. Therefore, the microlens made by using the mask of the present invention allows incident light to be focused on the corresponding photodiodes without error.

Second, when the shape of a cell is rectangular, the conventional microlens, whose curvature radius in the width direction differs from the one in the length direction, cannot focus incident light correctly onto the corresponding photodiode. The microlens of the present invention, whose curvature radius in the width direction is similar to the one in the length direction, prevents loss of incident light and ensures the enhancement of sensitivity and resolution to reduce smears in the picture.

It will be apparent to those skilled in the art that various modifications and variations can be made in the mask for patterning a microlens of the present invention without departing from the spirit or scope of the invention. Thus, it is intended that the present invention cover the modifications and variations of this invention provided they come within the scope of the appended claims and their equivalents.

What is claimed is:

1. A mask for patterning a microlens comprising:
   a substrate;
   a first light-blocking region on an area of the substrate; and
   a plurality of second light-blocking regions being spaced from the first light-blocking region, wherein a greater intensity of light is transmitted between each of the plurality of second light-blocking regions as the second light-blocking regions are spaced further apart from the first light-blocking region.

2. The mask according to claim 1, wherein the second light-blocking regions include light-blocking layers, the light-blocking layers having a greater interval space between each other as the light-blocking layers are located further away from the first light-blocking region.

3. The mask according to claim 1, wherein the second light-blocking regions include partially light-blocking layers, the partially light-blocking layers transmitting greater light as the partially light-blocking layers are located further away from the first light-blocking region.

4. The mask according to claim 3, wherein the light-blocking layers are positioned contiguously from the first light-blocking region.

5. The mask according to claim 1, wherein the first light-blocking region has one of a substantially square shape and a substantially rounded shape.

6. The mask according to claim 5, wherein the second light-blocking regions have substantially square shape and surround the first light-blocking region.

7. A mask for patterning a microlens comprising:
   a substrate;
   a first light-blocking region on an area of the substrate; and
   a plurality of second light-blocking regions being spaced from the first light-blocking region, wherein a lesser intensity of light is transmitted between each of the plurality of second light-blocking regions as the second light-blocking regions are spaced further apart from the first light-blocking region.

8. The mask according to claim 7, wherein the second light-blocking regions include light-blocking layers, the light-blocking layers having a lesser interval space between each other as the light-blocking layers are located further away from the first light-blocking region.

9. The mask according to claim 7, wherein the second light-blocking regions include partially light-blocking layers, the partially light-blocking layers transmitting lesser light as the partially light-blocking layers are located further away from the first light-blocking region.

10. The mask according to claim 9, wherein the light-blocking layers are positioned contiguously from the first light-blocking region.

11. The mask according to claim 7, wherein the first light-blocking region has one of a substantially square shape and a substantially rounded shape.

12. A mask for patterning a microlens comprising:
    a substrate;
    a main light-blocking layer on an area of the substrate; and
    a plurality of auxiliary light-blocking layers surrounding the main light-blocking layer,
    wherein as intervals between the main and auxiliary light-blocking layers become longer, spaces between the auxiliary light-blocking layers become wider.

13. The mask according to claim 12, wherein the plurality of the auxiliary light-blocking layers have a substantially same width.

14. The mask according to claim 12, wherein as intervals between the main and auxiliary light-blocking layers become longer, the widths of the auxiliary light-blocking layers become narrower.

15. The mask according to claim 12, wherein the main light-blocking layer has a square or rounded shape.

16. The mask according to claim 12, wherein the plurality of light-blocking layers include partially light-blocking layers contiguously surrounding the main light-blocking layer.

17. The mask according to claim 16, wherein the partially light-blocking layers have substantially same widths, and as intervals between the main and the partially light-blocking layers become longer, a photo-transmittivity of each partially light-blocking layer becomes higher.

18. A mask for patterning a microlens comprising:
    a substrate;
    a light-transmissive layer on an area of the substrate; and
    a plurality of light-blocking layers surrounding the light-transmissive layer, wherein as intervals between the light-blocking layers and light-transmissive layer become longer, spaces between light-blocking layers become narrower.

19. The mask according to claim 18, wherein the light-blocking layers have a substantially same width.

20. The mask according to claim 18, wherein the light-blocking layers have substantially same widths, and as intervals between the light-blocking layers and the light-transmissive layer become longer, widths of the light-blocking layers become wider.

21. The mask according to claim 18, wherein the light-transmissive layer has a square or rounded shape.

22. The mask according to claim 18, wherein the light-blocking layers partially block light and contiguously surround the light transmissive layer, and as intervals between the light transmissive layer and the light-blocking layers become longer, a photo-transmittivity of each light-blocking layer becomes higher.

23. A mask for patterning a microlens in a rectangular cell having a main light-blocking region and an auxiliary light-blocking region comprising:

a substrate;

a first main light-blocking layer on the substrate;

a plurality of second main light-blocking layers connected to the first main light-blocking layer along a first axis and each having a substantially trapezoidal shape; and a plurality of auxiliary light-blocking layers at the auxiliary light-blocking region adjacent to the first and second main light-blocking layers.

24. The mask according to claim 23, wherein the auxiliary light-blocking layers have a first width, and as intervals between the first and second main light-blocking layers and the auxiliary light-blocking layers become longer, spaces between the auxiliary light-blocking layers become wider to allow more light to pass therethrough.

25. The mask according to claim 23, wherein spaces between the auxiliary light-blocking layers have substantially same widths, and as intervals between the first and second main light-blocking layers and the auxiliary light-blocking layers become longer, widths of the auxiliary light-blocking layer become narrower to allow more light to pass therethrough.

26. The mask according to claim 23, wherein the auxiliary light-blocking layers are located where the first and second main light-blocking layers are not located.

27. The mask according to claim 23, wherein the trapezoidal shape of each of the second main light-blocking layers has one side having a substantially same dimension as a side of the cell.

28. The mask according to claim 23, wherein the first main light-blocking layer has a rectangular shape smaller than the cell and located at a central portion of the rectangular cell, and two trapezoidal-shaped second main light-blocking layers are located at side portions of the cell and connected to the first main light-blocking layer at opposite ends in a major axial direction of the rectangular cell.

29. The mask according to claim 28, wherein two sides of each of the trapezoidal-shaped second main light-blocking layers substantially coincide with diagonal lines of the rectangular cell.

30. A mask for patterning a microlens in a rectangular cell having a main light-blocking region and an auxiliary light-blocking region, the mask comprising:

a substrate;

a first light-transmissive layer on the substrate;

a plurality of second light-transmissive layers connected to the first light-transmissive layer along a first axis and each having a substantially trapezoidal shape; and a plurality of auxiliary light-blocking layers at the auxiliary light-blocking region adjacent to the first and second light-transmissive layers.

31. The mask according to claim 30, wherein the light-blocking layers have a first width, and as intervals between the first and second light-transmissive layers and the light-blocking layers become longer, spaces between the light-blocking layers become narrower.

32. The mask according to claim 30, wherein spaces between the light-blocking layers have substantially same widths, and as intervals between the first and second light-transmissive layers and the light-blocking layers become longer, widths of each light-blocking layer become narrower.

33. The mask according to claim 30, wherein the light-blocking layers are located where the first and second light-transmissive layers are not located.

34. The mask according to claim 30, wherein the trapezoidal shape of each of the second light-transmissive layers has one side having a substantially same dimension as a side of the cell.

35. The mask according to claim 30, wherein the first light transmissive layer has a rectangular shape smaller than the cell and located at a central portion of the rectangular cell, and two trapezoidal-shaped second light-transmissive layers are located at side portions of the cell and connected to the first light-transmissive layer at opposite ends in a major axial direction of the rectangular cell.

36. The mask according to claim 35, wherein two sides of each of the trapezoidal-shaped second light-transmissive layers substantially coincide with diagonal lines of the rectangular cell.

* * * * *